(12) United States Patent
Choi et al.

(10) Patent No.: US 10,939,557 B2
(45) Date of Patent: Mar. 2, 2021

(54) ORGANIC LIGHT EMITTING DISPLAY APPARATUS

(71) Applicant: LG Display Co., Ltd., Seoul (KR)

(72) Inventors: JinSol Choi, Paju-si (KR); ByungChan Song, Paju-si (KR); ChangIn Kim, Paju-si (KR); YongKyu Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/680,311

(22) Filed: Nov. 11, 2019

(65) Prior Publication Data
US 2020/0154572 A1 May 14, 2020

(30) Foreign Application Priority Data
Nov. 12, 2018 (KR) .......................... 10-2018-0138402

(51) Int. Cl.
*H05K 1/00* (2006.01)
*H05K 1/02* (2006.01)
(Continued)

(52) U.S. Cl.
CPC ......... *H05K 1/189* (2013.01); *H01L 27/3276* (2013.01); *H05K 1/0219* (2013.01);
(Continued)

(58) Field of Classification Search
CPC .. H05K 1/00; H05K 1/02; H05K 1/18; H05K 1/189; H05K 1/177; G09G 3/20;
(Continued)

(56) References Cited

U.S. PATENT DOCUMENTS 6,657,622 B2  12/2003  Park
6,867,758 B2  3/2005  Nah et al.
(Continued)

FOREIGN PATENT DOCUMENTS

JP  2002-091367 A  3/2002
JP  2002-196314 A  7/2002
(Continued)

OTHER PUBLICATIONS

Japanese Office Action, Japan Patent Office Application No. 2019-204583, dated Dec. 22, 2020, eight pages.

*Primary Examiner* — Xiaoliang Chen
(74) *Attorney, Agent, or Firm* — Fenwick & West LLP

(57) ABSTRACT

An organic light emitting display apparatus is provided that includes a display panel, a first source printed circuit board connected to the display panel in a first direction, and including a first memory disposed in an area of first source printed circuit board, a second source printed circuit board connected to the display panel in the first direction, and a control printed circuit board disposed between the first source printed circuit board and the second source printed circuit board, and connected to each of the first source printed circuit board and the second source printed circuit board. Here, a direction in which the control printed circuit board and the first source printed circuit board are connected and a direction in which the control printed circuit board and the second source printed circuit board are connected are a second direction different from the first direction.

15 Claims, 17 Drawing Sheets

(51) Int. Cl.
*H05K 1/18* (2006.01)
*G09G 3/20* (2006.01)
*G09G 3/32* (2016.01)
*G09G 3/36* (2006.01)
*G09G 3/3233* (2016.01)
*G09G 3/3258* (2016.01)
*G09G 3/3266* (2016.01)
*G09G 3/3275* (2016.01)
*G09G 3/3291* (2016.01)
*G06F 3/038* (2013.01)
*G06F 3/045* (2006.01)
*H01L 27/32* (2006.01)
*H05K 1/14* (2006.01)

(52) U.S. Cl.
CPC ........... *H05K 1/148* (2013.01); *G09G 3/3275* (2013.01); *G09G 2310/08* (2013.01); *H05K 2201/10128* (2013.01); *H05K 2201/10159* (2013.01)

(58) Field of Classification Search
CPC .......... G09G 3/32; G09G 3/36; G09G 3/3233; G09G 3/3258; G09G 3/3266; G09G 3/3275; G09G 3/3291; G06F 3/038; G06F 3/045
USPC ...... 361/749, 688; 345/82, 92, 99, 102, 212, 345/214, 691; 349/58, 76.1
See application file for complete search history.

(56) References Cited

U.S. PATENT DOCUMENTS

| | | | |
|---|---|---|---|
| 7,116,299 B2 | 10/2006 | Nah et al. | |
| 9,105,234 B2* | 8/2015 | Kim | G11C 19/28 |
| 9,817,512 B1* | 11/2017 | Kim | G06F 3/0418 |
| 2002/0008682 A1 | 1/2002 | Park | |
| 2002/0060661 A1 | 5/2002 | Nah et al. | |
| 2003/0213619 A1* | 11/2003 | Denzene | H05K 1/0243 |
| | | | 174/261 |
| 2005/0219177 A1 | 10/2005 | Nah et al. | |
| 2008/0038941 A1* | 2/2008 | Bartholomew | H05K 1/0219 |
| | | | 439/76.1 |
| 2010/0283777 A1* | 11/2010 | Sang | G09G 3/3696 |
| | | | 345/212 |
| 2010/0309236 A1* | 12/2010 | Min | G09G 3/3648 |
| | | | 345/691 |
| 2010/0328569 A1* | 12/2010 | Cho | G02F 1/133308 |
| | | | 349/58 |
| 2011/0221789 A1 | 9/2011 | Ota | |
| 2013/0027925 A1* | 1/2013 | Mayer | H05B 45/24 |
| | | | 362/230 |
| 2014/0043218 A1 | 2/2014 | Ota | |
| 2014/0139413 A1* | 5/2014 | Kwon | G09G 3/3208 |
| | | | 345/82 |
| 2015/0243254 A1* | 8/2015 | Choi | G09G 5/18 |
| | | | 345/212 |
| 2016/0063918 A1* | 3/2016 | Choi | G09G 3/3233 |
| | | | 345/214 |
| 2016/0117988 A1* | 4/2016 | Lee | G09G 3/3233 |
| | | | 345/205 |
| 2017/0004773 A1* | 1/2017 | Kim | G09G 3/006 |
| 2017/0004776 A1* | 1/2017 | Park | G09G 3/3208 |
| 2017/0196066 A1* | 7/2017 | Dong | H05B 45/22 |
| 2017/0322608 A1* | 11/2017 | Lee | G06F 1/26 |
| 2018/0024396 A1* | 1/2018 | Kang | G02F 1/133308 |
| | | | 361/688 |
| 2018/0182278 A1* | 6/2018 | Kim | G09G 3/2018 |
| 2018/0182288 A1* | 6/2018 | Kim | G09G 3/3291 |
| 2019/0005906 A1* | 1/2019 | Chen | G02F 1/136286 |
| 2020/0320910 A1 | 10/2020 | Horibe | |

FOREIGN PATENT DOCUMENTS

| | | |
|---|---|---|
| JP | 2007-043213 A | 2/2007 |
| JP | 2009-020228 A | 1/2009 |
| JP | 2011-186363 A | 9/2011 |
| JP | 2012-168358 A | 9/2012 |
| JP | 2013-197455 A | 9/2013 |
| KR | 2017-0118509 A | 10/2017 |
| WO | WO 2017/203580 A1 | 11/2017 |

* cited by examiner

ORGANIC LIGHT EMITTING DISPLAY APPARATUS

CROSS-REFERENCE TO RELATED APPLICATIONS

This application claims the priority benefit of Republic of Korea Patent Application No. 10-2018-0138402, filed on Nov. 12, 2018 in the Korean Intellectual Property Office, the disclosure of which is incorporated herein by reference in its entirety

BACKGROUND

Field of the Disclosure

The present disclosure relates to organic light emitting display apparatuses.

Description of the Background

As the information society has developed at a rapid rate, there is an increasing need for display apparatuses employing advanced technologies and more efficient methods. Recently, various types of flat display apparatuses, such as a liquid crystal display (LCD) apparatus, a plasma display panel (PDP) apparatus, an organic light emitting display (OLED) apparatus, or the like, have been developed and utilized.

The organic light emitting display apparatus has characteristics of displaying images using a self-emissive diode, an organic light emitting diodes (OLED), and has advantages of a high contrast ratio and a wide viewing angle. Further, the organic light emitting display apparatus has advantages of being implemented as a relatively thin package.

In the organic light emitting display apparatus, a circuitry is required for supplying a driving signal and a driving voltage, and can be sometimes located on a lower portion of the organic light emitting display apparatus. The circuitry can comprise a control printed circuit board and a plurality of source printed circuit boards, and flexible cables can connect between the control printed circuit board and the source printed circuit boards and between the source printed circuit boards. However, as the flexible cables are longer, there is a possibility that a delivered signal can be distorted.

Further, the circuitry may be located on a rear surface of the organic light emitting display apparatus. In some instance, a cover shield covering the circuitry may be disposed on the rear surface of the organic light emitting diode display.

The increased thickness of the rear surface of the organic light emitting display apparatus due to the circuitry and the cover shield may result in the advantage of the organic light emitting display apparatus being reduced.

SUMMARY

Accordingly, the present disclosure is directed to an organic light emitting display apparatus that substantially obviates one or more problems due to limitations and disadvantages of the prior art.

It is at least one object of the present disclosure to provide an organic light emitting display apparatus capable of reducing a signal distortion.

It is at least one object of the present disclosure to provide an organic light emitting display apparatus having a thin rear surface.

In accordance with one aspect of the present disclosure, an organic light emitting display apparatus is provided that includes a display panel, a first source printed circuit board connected to the display panel in a first direction, and including a first memory disposed in an area of first source printed circuit board, a second source printed circuit board connected to the display panel in the first direction, and a control printed circuit board disposed between the first source printed circuit board and the second source printed circuit board, and connected to each of the first source printed circuit board and the second source printed circuit board. Here, a direction in which the control printed circuit board and the first source printed circuit board are connected to each other and a direction in which the control printed circuit board and the second source printed circuit board are connected to each other are a second direction different from the first direction.

In accordance with embodiments of the present disclosure, it is possible to provide an organic light emitting display apparatus capable of reducing a signal distortion.

In accordance with embodiments of the present disclosure, it is possible to provide an organic light emitting display apparatus having a thin rear surface.

Additional features and advantages of the disclosure will be set forth in the description which follows and in part will be apparent from the description, or may be learned by practice of the disclosure. The objectives and other advantages of the disclosure will be realized and attained by the structure particularly pointed out in the written description and claims hereof as well as the appended drawings.

DETAILED DESCRIPTION

Figure 1:
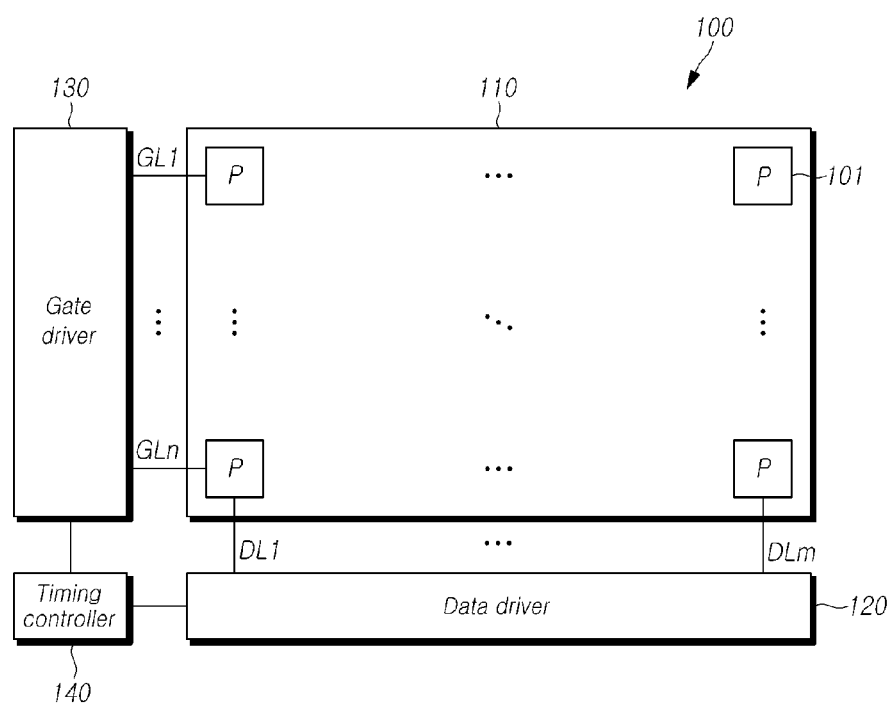
FIG. 1 is a schematic view of an organic light emitting display apparatus according to embodiments of the present disclosure.

Hereinafter, the present preferred embodiments of the disclosure will be described in detail with reference to the accompanying drawings. In denoting elements of the drawings by reference numerals, the same elements will be referenced by the same reference numerals although the elements are illustrated in different drawings. In the following description of the disclosure, detailed description of known functions and configurations incorporated herein may be omitted when it may make the subject matter of the disclosure rather unclear.

Terms, such as first, second, A, B, (A), or (B) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element.

FIG. 1 is a schematic view of an organic light emitting display apparatus according to embodiments of the present disclosure.

Referring to FIG. 1, the organic light emitting display apparatus 100 can comprise a display panel 110, a data driver 120, a gate driver 130, a timing controller 140.

The display panel 110 can comprise a plurality of data lines (DL1, ..., DLm) arranged in a first direction and a plurality of gate lines (GL1, ..., GLn) arranged in a second direction. FIG. 1 shows that the plurality of data lines (DL1, ..., DLm) and the plurality of gate lines (GL1, ..., GLn) intersect each other at a certain angle, such as run perpendicular to each other, but embodiments of the present disclosure are not limited thereto. The display panel 110 can comprise a plurality of pixels 101 arranged to be corresponded to areas in which the plurality of gate lines (GL1, ..., GLn) and the plurality of data lines (DL1, ..., DLm) intersect each other. The plurality of pixels can include organic light emitting diodes and at least one pixel circuit supplying a driving current to the organic light emitting diodes. The pixel circuit is connected to one or more gate lines (GL1, ..., GLn) and one or more data lines (DL1, ..., DLm), and can supply the driving current to one or more organic light emitting diodes. Luminance of light emitted from the organic light emitting diode may depend on the magnitude of a driving current. Here, lines arranged in the display panel 110 are not limited to the gate lines (GL1, ..., GLn) and the data lines (DL1, ..., DLm).

The data driver 120 can apply one or more data signals to the plurality of data lines (DL1, ..., DLm). The data signals may correspond to gray scales, and a voltage level of the data signals may be determined depending on a corresponding gray scale. A voltage of the data signals may be sometimes referred to as a data voltage. Further, the data driver 120 can sense aging information from the pixel 101. Information obtained by sensing the pixel 101 by the data driver 120 is not limited thereto.

It is noted that one data driver 120 is illustrated in FIG. 1, but embodiments of the present disclosure are not limited thereto. For example, two or more data drivers may be employed according to the size or resolution of the display panel 110. The data driver 120 may be implemented as an integrated circuit (IC). The data driver 120 implemented in the form of the integrated circuit may be sometimes referred to as a driver IC.

The gate driver 130 can apply one or more gate signals to the plurality of gate lines (GL1, ..., GLm). Pixels 101 corresponding to the plurality of gate lines (GL1, ..., GLn) to which a gate signal is applied can receive a data signal. The gate driver 130 can transfer a sensing signal to the pixel 101. The pixel 101 received the sensing signal outputted from the gate driver 130 can receive a sensing voltage output from the data driver 120. It is noted that one gate driver 130 is illustrated in FIG. 1, but embodiments of the present disclosure are not limited thereto. For example, two or more gate drivers may be employed according to the size or resolution of the display panel 110. The gate driver 130 can comprise two gate drivers disposed on two edges of the display panel 110, such as both sides thereof. One of the gate drivers can be connected to one or more odd numbered gate lines of the plurality of gate lines (GL1, ..., GLn) and the other can be connected to one or more even numbered gate lines of the plurality of gate lines (GL1, ..., GLn). However, embodiments of the present disclosure are not limited thereto. For example, the gate drivers may be disposed on the top and bottom edges of the display panel 110. The gate driver 130 may be implemented as an integrated circuit.

The timing controller 140 can control the data driver 120 and the gate driver 130. The timing controller 140 can transmit image data corresponding to a data signal to the data driver 120. The image data may be a digital signal. The timing controller 140 can correct the image signal and then transmit the corrected image signal to the data driver 120. Operations of the timing controller 140 are not limited thereto, and other various operations or controlling thereof are available. The timing controller 140 may be implemented as an integrated circuit.

Figure 2:
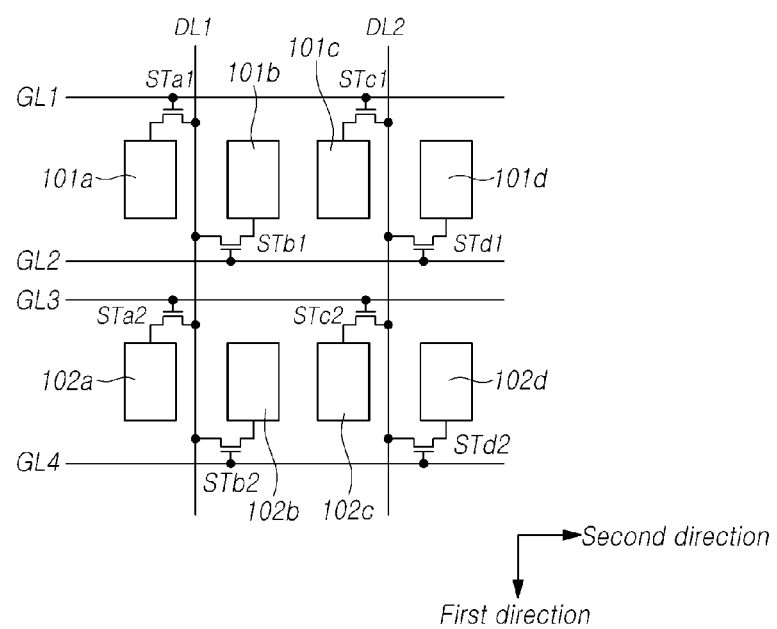
FIG. 2 is a circuit diagram illustrating four group of adjacent subpixels arranged in a display panel shown in FIG. 1 according to embodiments of the present disclosure.

FIG. 2 is a circuit diagram illustrating four adjacent subpixels arranged in the display panel shown in FIG. 1 according to embodiments of the present disclosure.

Referring to FIG. 2, the display panel 100 comprises two data lines, a first data line DL1 and a second data line DL2, which extent in a first direction and run parallel to each other, and four gate lines, a first gate line GL1, a second gate line GL2, a third gate line GL3 and a fourth gate line GL4, which extent in a second direction and run parallel to one another. The second gate line GL2 and the third gate line GL3 of the first to fourth gate lines (GL1, GL2, GL3 and GL4) may be arranged adjacent to each other. The adjacent arrangement of the second gate line GL2 and the third gate line GL3 may mean that no pixel is disposed between the second gate line GL2 and the third gate line GL3. However, embodiments of the present disclosure are not limited thereto.

A switching transistor STa1 of a first pixel 101a can be connected to the first data line DL1 and the first gate line GL1. A switching transistor STb1 of a second pixel 101b can be connected to the first data line DL1 and the second gate line GL2. A switching transistor STc1 of a third pixel 101c can be connected to the second data line DL2 and the first gate line GL1. A switching transistor STd1 of a fourth pixel 101d can be connected to the second data line DL2 and the second gate line GL2.

A switching transistor Sta2 of a fifth pixel 102a can be connected to the first data line DL1 and the third gate line GL3. A switching transistor STb2 of a sixth pixel 102b can be connected to the first data line DL1 and the fourth gate line GL4. A switching transistor STc2 of a seventh pixel 102c can be connected to the second data line DL2 and the third gate line GL3. A switching transistor STd2 of an eighth pixel 102d can be connected to the second data line DL2 and the fourth gate line GL4.

FIG. 2 shows that the pixels are arranged in 4×2 on the display panel 110, but such an arrangement is merely one example of possible arrangements, for convenience of description and ease of understanding. Embodiments of the present disclosure are not limited thereto.

In this display panel 110, the pixels are configured to receive data signals such that the first pixel 101a and the second pixel 101b receive data signals at different times, by transmitting a data signal to each data line DL1 or DL2 two times during one horizontal period Hsync and sequentially applying a first gate signal and a second gate signal to the first gate line GL1 and the second gate line GL2, respectively. Driving the display panel 110 in this way may be referred to as a double rate driving (hereinafter, referred to as "DRD") scheme.

When the DRD is used for driving the organic light emitting display apparatus 100, the number of data lines (DL1, . . . , DLn) can be reduced. Therefore, a data driver 120 having a small number of channels that output data signals can be employed to the organic light emitting display apparatus 100. With such an arrangement, the data driver 120 applied to the display panel 110 can be configured to include a small number of channels that output data signals relative to resolution. Further, when the data driver 120 employs a plurality of driver integrated circuits (IC), the number of driver ICs can be reduced. FIG. 2 shows that two pixels can receive a data signal through one data line. However, embodiments of the present disclosure are not limited thereto. For example, four pixels can receive a data signal through one data line depending on designs or configurations of pixels.

Figure 3:
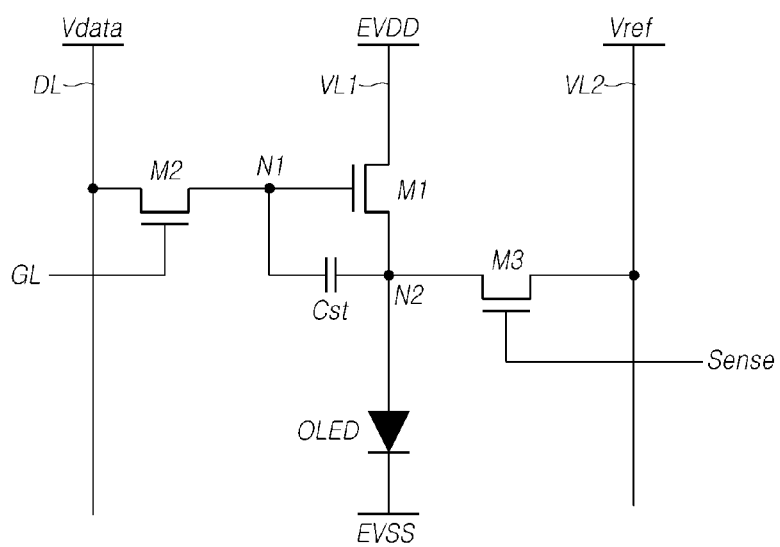
FIG. 3 is a circuit diagram illustrating a pixel shown in FIG. 1 according to embodiments of the present disclosure.

FIG. 3 is a circuit diagram illustrating a pixel shown in FIG. 1 according to embodiments of the present disclosure.

Referring to FIG. 3, the pixel 101 can comprise an organic light emitting diode (OLED) and a pixel circuit for driving the organic light emitting diode (OLED). The pixel circuit can comprise a first transistor M1, a second transistor M2, a third transistor M3, and a capacitor Cst.

A first electrode of the first transistor M1 can be connected to a first power supply line VL1 for delivering a high voltage EVDD. The gate electrode and a second electrode of the first transistor M1 can be connected to a first node N1 and a second node N2, respectively. The first transistor M1 causes a current to flow through the second node N2 when a voltage is delivered to the first node N1. The first electrode and the second electrode of the first transistor M1 may be a drain electrode and a source electrode, respectively. However, embodiments of the present disclosure are not limited thereto. For example, the first electrode and the second electrode of the first transistor M1 may be the source electrode and the drain electrode, respectively.

A current flowing through the second node N2 may correspond to Equation 1 as follows.

$$Id=k(Vgs-Vth)^2 \qquad \text{[Equation 1]}$$

Here, the Id denotes an amount of current flowing through the second node N2, the k denotes electron mobility of a transistor, the Vgs denotes a difference in voltages between the gate electrode and the source electrode of the first transistor M1, and the Vth denotes a threshold voltage of the first transistor M1.

Accordingly, as an amount of current varies depending on deviations in the electron mobility and the threshold voltage, it is therefore possible to prevent the quality of displayed images from being degraded by correcting a data signal for a deviation in the electron mobility and the threshold voltage. Further, the electron mobility may vary depending on temperature. The first transistor M1 may be sometimes referred to as a driving transistor.

The gate electrode of the second transistor M2 can be connected to a gate line GL, and first and second electrodes of the second transistor M2 can be connected to a data line DL and the first node N1, respectively. Accordingly, the second transistor M2 causes a data voltage Vdata corresponding to a data signal to be transferred to the first node N1 in response to a gate signal delivered through the gate line GL. The first electrode and the second electrode of the second transistor M2 may be a drain electrode and a source electrode, respectively. However, embodiments of the present disclosure are not limited thereto. For example, the first electrode and the second electrode of the second transistor M2 may be the source electrode and the drain electrode, respectively. The second transistor M2 may be matched to the switching transistors Sta1 to Stb2 of FIG. 2.

The gate electrode of the third transistor M3 can be connected to a sensing control line Sense, and first and second electrodes of the third transistor M3 can be connected to the second node N2 and a second power supply line VL2 for delivering a reference voltage Vref, respectively. The third transistor M3 causes the reference voltage Vref in the second node N2 to be transferred to the second power supply line VL2 in response to a sensing control signal delivered through the sensing control line Sense. The first electrode and the second electrode of the third transistor M3 may be a drain electrode and a source electrode, respectively. However, embodiments of the present disclosure are not limited thereto. For example, the first electrode and the source electrode of the third transistor M3 may be the source electrode and the drain electrode, respectively.

First and second electrodes of the capacitor Cst can be connected to the first and second nodes N1 and N2, respectively. The capacitor Cst can enable voltages in the gate electrode and the source electrode of the first transistor M1 to be substantially constantly maintained.

The anode electrode and the cathode electrode of the organic light emitting diode (OLED) can be connected to the second node N2 and a low voltage EVSS, respectively. The low voltage EVSS may be a ground. However, embodiments of the present disclosure are not limited thereto. For example, the low voltage EVSS may be lower or higher by a predetermined level than a ground voltage. The low voltage EVSS may be supplied through a low power supply line. When a current flows from the anode electrode to the cathode electrode, the organic light emitting diode (OLED) can emit light depending on an amount of the current. The organic light emitting diode (OLED) can emit light of any one of red, green, blue, and white. However, embodiments of the present disclosure are not limited thereto.

A pixel circuit that can be employed in the organic light emitting display apparatus 100 is not limited to the pixel circuits described above and shown in FIGS. 2 and 3.

Figure 4:
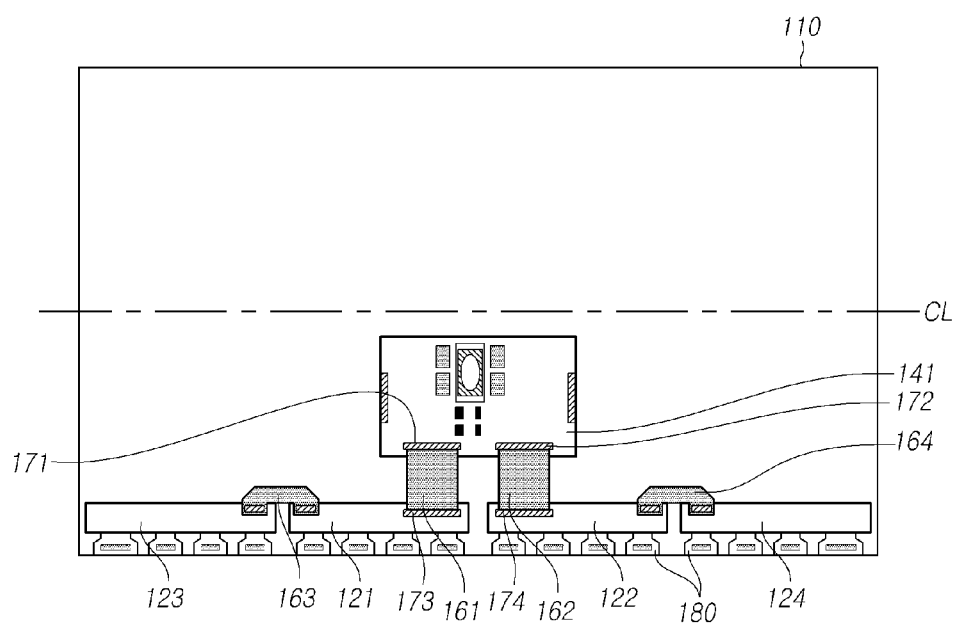
FIG. 4 is a plan view of a rear surface of the organic light emitting display apparatus shown in FIG. 1 according to an embodiment of the present disclosure.
Figure 5:
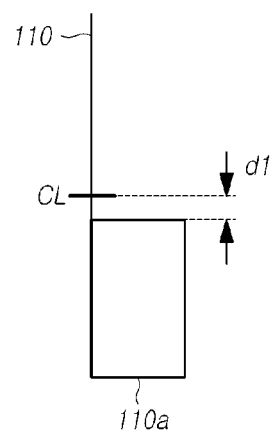
FIG. 5 is a side view of the organic light emitting display apparatus shown in FIG. 4 according to an embodiment of the present disclosure.

FIG. 4 is a plan view of a rear surface of the organic light emitting display apparatus shown in FIG. 1 in accordance with an embodiment of the present disclosure, and FIG. 5 is a side view of the organic light emitting display apparatus shown in FIG. 4 according to an embodiment of the present disclosure.

Referring to FIGS. 4 and 5, a control printed circuit board 141 and first, second, third, and fourth source printed circuit boards 121 to 124 can be disposed on a rear surface of the display panel of the organic light emitting display apparatus 100. FIG. 4 shows that the display panel comprises the four source printed circuit boards 121 to 124. However, embodiments of the present disclosure are not limited thereto. The number of source printed circuit boards included in the display panel may be larger or smaller than four.

The control printed circuit board 141 can be connected to the first and second source printed circuit boards 121 and 122 using first and second flexible cables 161 and 162, respectively. The first and second flexible cables 161 and 162 can be connected to respective first and second connectors 171 and 172 disposed on the control printed circuit board 141, and connected to respective third and fourth connectors 173 and 174 disposed on the respective first and second source printed circuit boards 121 and 122. The first and second source printed circuit boards 121 and 122 can be connected to the third and fourth source printed circuit boards 123 and 124 respectively using respective third and fourth flexible cables 163 and 164. The flexible cables 161 to 164 may be flexible flat cables (FFC) or flexible printed circuits (FPC). However, embodiments of the present disclosure are not limited thereto.

The organic light emitting display apparatus 100 can comprise a plurality of films 180, on each or at least one of which a driver IC (not shown) can be disposed. One end of each of the plurality of films 180 can be connected to one of the first to fourth source printed circuit boards 121 to 124, and the other end thereof can be connected to the display panel 110. Through lines arranged on the film 180, the driver IC can transmit a signal to or receive a signal from the display panel 110, and transmit a signal to or receive a signal from lines arranged on the first to fourth source printed circuit boards 121 to 124.

In the organic light emitting display apparatus 100 configured as described above, the control printed circuit board 141 can be located near the center line CL of the rear surface of the display panel 110 by the size of the control printed circuit board itself 141 and the length of the flexible cables 161 and 162. Accordingly, as shown in FIG. 5, a case 110a protecting the rear surface of the organic light emitting display apparatus 100 can protrude up to a distance d1 from the center line CL.

Figure 6:
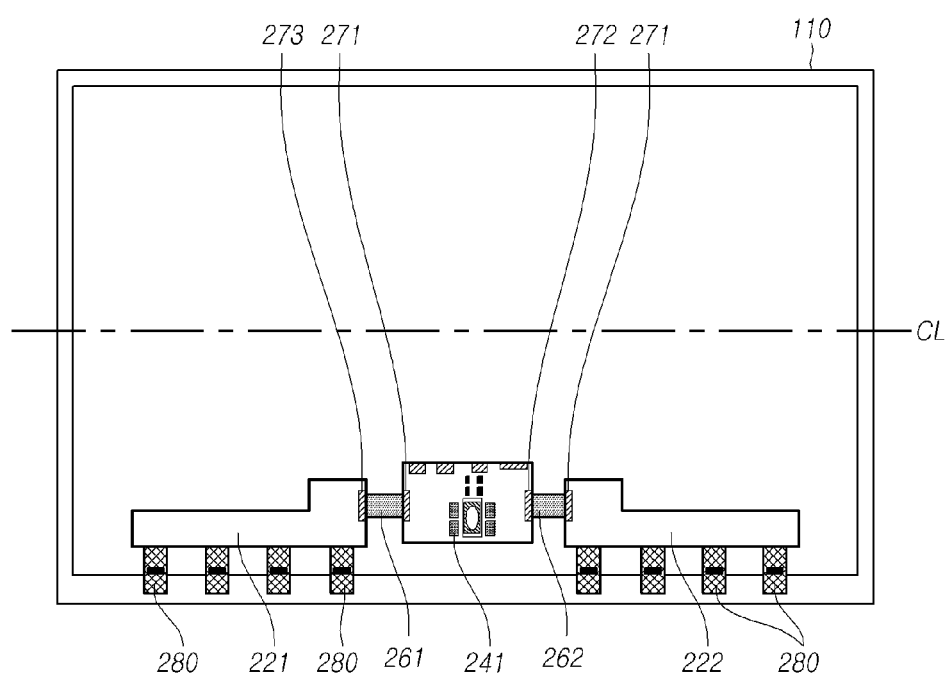
FIG. 6 is a plan view of a rear surface of the organic light emitting display apparatus shown in FIG. 1 according to another embodiment of the present disclosure.
Figure 7:
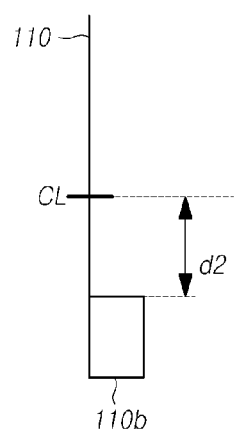
FIG. 7 is a side view of the organic light emitting display apparatus shown in FIG. 6 according to an embodiment of the present disclosure.

FIG. 6 is a plan view of a rear surface of the organic light emitting display apparatus shown in FIG. 1 in accordance with another embodiment of the present disclosure, and FIG. 7 is a side view of the organic light emitting display apparatus shown in FIG. 6 according to an embodiment of the present disclosure.

Referring to FIGS. 6 and 7, the organic light emitting display apparatus 100 can comprise the display panel 110, a control printed circuit board 241 disposed on the rear surface of the display panel 110, and first and second source printed circuit boards 221 and 222. The control printed circuit board 241 can be disposed between the first and second source printed circuit boards 221 and 222. The control printed circuit board 241 can be connected to each of the first and second source printed circuit boards 221 and 222. The first and second source printed circuit boards 221 and 222 can be connected to the display panel 110 in a first direction. The control printed circuit board 241 can be connected to each of the first and second source printed circuit boards 221 and 222 in a second direction. The first and second directions may be different. The first direction may be a vertical direction relative to the display panel 110, and the second direction may be a horizontal direction relative to the display panel 110. FIG. 6 shows that the display panel comprises the two source printed circuit boards 121 and 221. However, embodiments of the present disclosure are not limited thereto. The number of source printed circuit boards included in the display panel may be larger or smaller than two. The control printed circuit board 241 can be connected to two facing surfaces of the first and second source printed circuit boards 221 and 222 which are spaced a certain distance apart from each other.

The control printed circuit board 241 can be connected to the first and second source printed circuit boards 221 and 222 using respective first and second flexible cables 261 and 262. The first flexible cables 261 can be connected to a first connector 271 disposed on the control printed circuit board 241 and a third connector 273 disposed on the first source printed circuit board 221. The second flexible cable 262 can be connected to a second connector 272 disposed on the control printed circuit board 241 and a fourth connector 274 disposed on the second source printed circuit board 222. The first connector 271 and the third connector 273 are disposed on two facing surfaces of the control printed circuit board 241 and the first source printed circuit board 221 respectively which are spaced a certain distance apart from each other. The second connector 272 and the fourth connector 274 are disposed on two facing surfaces of the control printed circuit board 241 and the second source printed circuit board 222 respectively which are spaced a certain distance apart from each other. In this way, the length of the flexible cables 261 and 262 can be minimized or reduced. Methods of connecting between the control printed circuit board 241 and the first source printed circuit board 221 or connecting between the control printed circuit board 241 and the second source printed circuit board 222 are not limited to specific methods described above. The flexible cables 261 and 262 may be flexible flat cables (FFC) or flexible printed circuits (FPC). However, embodiments of the present disclosure are not limited thereto.

The organic light emitting display apparatus 100 can comprise a plurality of films 280, on each or at least one of which the driver IC can be disposed. One end of each of the plurality of films 280 can be connected to the first or second source printed circuit board 221 or 222, and the other end thereof can be connected to the display panel 110. Through lines arranged on the film 280, the driver IC can transmit a signal to or receive a signal from the display panel 110, and transmit a signal to or receive a signal from lines arranged on the first or second source printed circuit board 221 or 222. A power supply line can be disposed on the film 280.

The first flexible cable 261 connecting between the control printed circuit board 241 and the first source printed circuit board 221 can be disposed between the control printed circuit board 241 and the first source printed circuit board 221. The second flexible cable 262 connecting between the control printed circuit board 241 and the second source printed circuit board 222 can be disposed between the control printed circuit board 241 and the second source printed circuit board 222. In this way, it is possible to reduce the length of the flexible cables 261 and 262, by connecting between two facing surfaces of the control printed circuit board 241 and the first source printed circuit board 221 using the first flexible cable 261, or connecting between two facing surfaces of the control printed circuit board 241 and the second source printed circuit board 222 using the second flexible cable 262, As the length of the flexible cables 261 and 262 becomes shorter, it is possible to minimize or reduce a distortion of a signal delivered through the flexible cables 261 and 262.

Since the control printed circuit board 241 is disposed between the first source printed circuit board 221 and the second source printed circuit board 222, it is possible to prevent the control printed circuit board 241 from being located in the vicinity of the center line CL of the display panel 110. Accordingly, as shown in FIG. 7, a distance d2 between the rear case 110b of the organic light emitting display apparatus 100 and the center line CL can be greater than the distance d1 of FIG. 5. Thus, a height of the thick portion of the rear surface of the organic light emitting display apparatus 100 can be reduced in comparison with the organic light emitting display apparatus shown in FIG. 5. Therefore, the size of the portion protruded from the rear surface of the organic light emitting display apparatus 100 can be reduced. As a result, the thickness of the organic light emitting display apparatus can be thinner.

Figure 8:
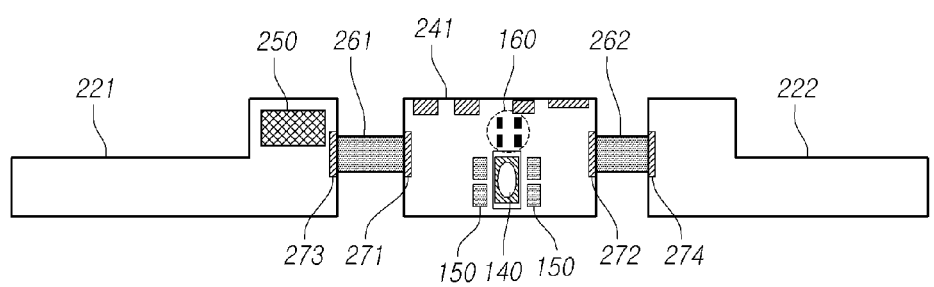
FIG. 8 is a plan view of a first embodiment of an arrangement of a first source printed circuit board, a second source printed circuit board, and a control printed circuit board shown in FIG. 6 according to an embodiment of the present disclosure.
Figure 9:
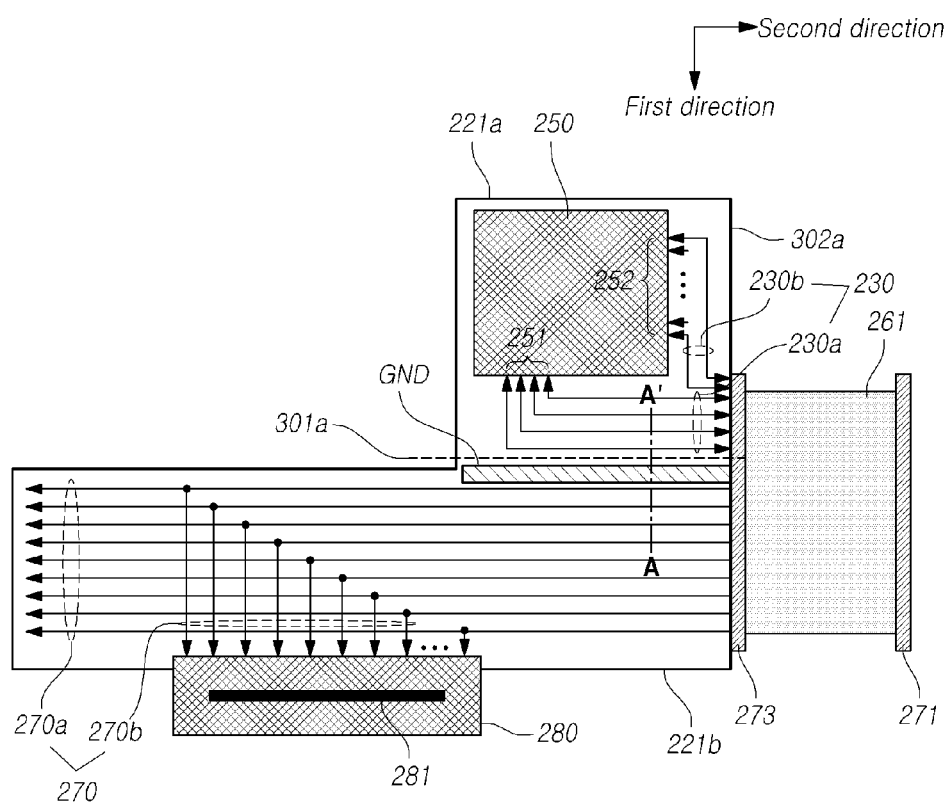
FIG. 9 is an enlarged plan view of the first source printed circuit board and a flexible cable shown in FIG. 8 according to an embodiment of the present disclosure.
Figure 10:
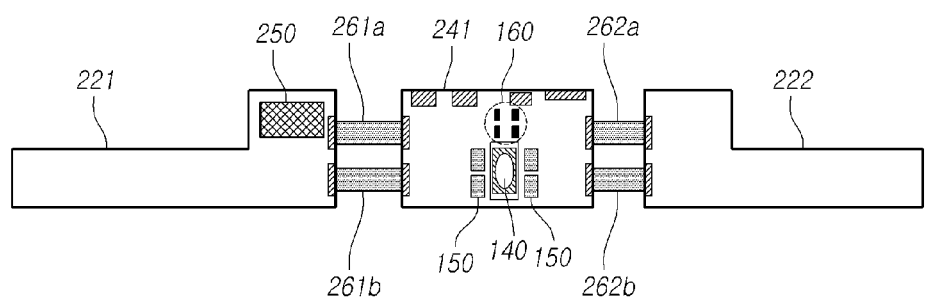
FIG. 10 is a plan view of a second embodiment of an arrangement of the first source printed circuit board, the second source printed circuit board, and the control printed circuit board shown in FIG. 6.
Figure 11:
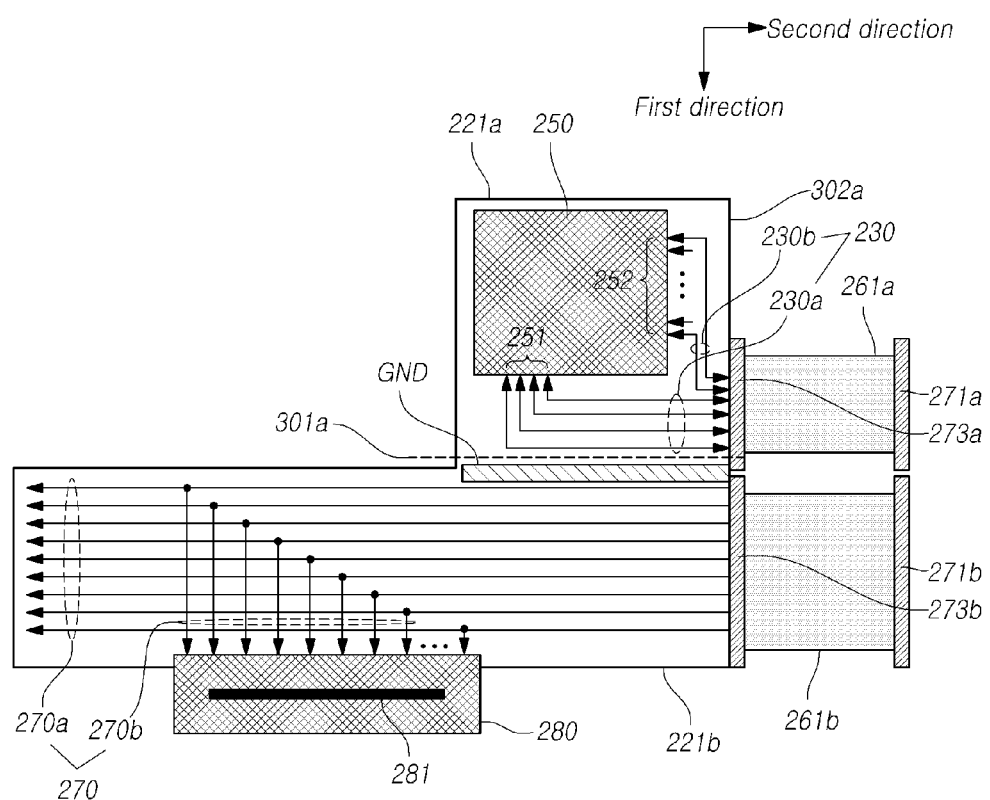
FIG. 11 is an enlarged plan view of the first source printed circuit board and the flexible cable shown in FIG. 8 according to an embodiment of the present disclosure.

FIG. 8 is a plan view of a first embodiment of an arrangement of the first source printed circuit board, the second source printed circuit board, and the control printed circuit board shown in FIG. 6 according to an embodiment of the present disclosure. FIG. 9 is an enlarged plan view of the first source printed circuit board and the flexible cable shown in FIG. 8 according to an embodiment of the present disclosure. FIG. 10 is a plan view of a second embodiment of an arrangement of the first source printed circuit board, the second source printed circuit board, and the control printed circuit board shown in FIG. 6 according to an embodiment of the present disclosure. FIG. 11 is an enlarged plan view of the first source printed circuit board and the flexible cable shown in FIG. 8 according to an embodiment of the present disclosure.

Referring to FIGS. 8 to 11, the first source printed circuit board 221 can comprise a first area 221a in which a first memory 250 and a first signal line 230 are disposed, and a second area 221b in which a second signal line 270 connected to the film 280 on which the driver IC 281 is disposed is disposed. The second source printed circuit board 222 can be disposed in the same form or pattern as the first source printed circuit board 221. However, embodiments of the present disclosure are not limited thereto. The first memory 250 is shown to be located on the first source printed circuit board 221 in the drawings. However, embodiments of the present disclosure are not limited thereto. For example, the first memory 250 may be located on the second source printed circuit board 222.

The first and second source printed circuit boards 221 and 222 may not have constant widths in the second direction by the first area 221a. The sum of widths of the first and second areas 221a and 221b may be the same as the width of the control printed circuit board 241. However, embodiments of the present disclosure are not limited thereto. Herein, the first and second areas 221a and 221b are shown as a rectangular shape, but embodiments of the present disclosure are not limited thereto. The first area 221a can comprise a first surface 301a facing or corresponding to the second area 221b and a second surface 302a facing or corresponding to the control printed circuit board 241. The first surface 301a can be a virtual line, and all or part of the first surface 301a can contact the second area 221b.

The first memory 250, and the first signal line 230 for transmitting a signal to or receiving a signal from the first memory 250 can be disposed in the first area 221a. The first memory 250 can prevent data stored therein from being reset even when power is turned off. The first memory 250 may be a NAND flash memory. The NAND flash memory is a nonvolatile memory capable of storing data even when power is turned off. The first memory 250 can store a threshold voltage of a driving transistor, electron mobility, camera compensation data, a reference value, or the like, of the display panel 110, and provide stored data to a second memory 150 when the organic light emitting display apparatus 100 is turned on. The driving transistor may be the first transistor M1 in FIG. 3.

When the first memory 250 is replaced with another one although it stores characteristic values of the display panel 110, there may occur a situation where accurate characteristic values of the display panel 110 cannot be used or data stored in the first memory 250 should be backed up. In case the first memory 250 is disposed on the first source printed circuit board 221 or the second source printed circuit board 222, even when the control printed circuit board 241 is replaced due to any reason, it is not necessary to replace the first memory 250; therefore, it is possible to prevent such a situation from occurring.

A control signal input terminal 251 of the first memory 250 for receiving a control signal can be disposed on a surface facing or corresponding to the first surface 301a of the first area 221a, and a data signal input and output terminal 252 of the first memory 250 for enabling a data signal to be input or output can be disposed on a surface facing or corresponding to the second surface 302a. The surface facing or corresponding to the first surface 301a may be a surface parallel and closest adjacent to the first surface 301a, among surfaces of the first memory 250, and the surface facing or corresponding to the second surface 302a may be a surface parallel and closest adjacent to the second surface 302a. The control signal input terminal 251 can be connected to a control signal line 230a of the first signal line 230 including a plurality of lines.

The control signal line 230a can comprise a signal line for delivering a signal including a first memory read (Nand_read_en) command from the timing controller 140, and a signal including a first memory write (Nand_write_en) command. The signals including the commands delivered by the control signal line 230a are not limited thereto. The first memory 250 can operate in response to the commands included in the signals delivered from the control signal line 230a. The signals delivered through the control signal line 230a are unidirectional signals delivered from the timing controller 140 to the first memory 250.

The data signal input and output terminal 252 can be connected to a data signal line 230b of the first signal line 230. The data signal input and output terminal 252 can enable data stored in the first memory 250 to be output and delivered to the second memory 150, or enable data stored in the second memory 150 to be received and stored in the first memory 250, according to the commands delivered through the control signal line 230a of the first signal line 230.

The film 280 on which the driver IC 281 is disposed, and the second signal line 270 for supplying a signal to the driver IC 281 and delivering a signal output from the driver IC 281 can be disposed in the second area 221b. However, embodiments of the present disclosure are not limited thereto. For example, a power supply line for supplying power can be disposed in the second area 221b. The second signal line 270 can comprise a first line 270a including a plurality of lines that extend in the second direction. The second signal line 270 extends in the first direction to be connected to one or more lines disposed on the film 280 including the driver IC 281 and can comprise a second line 270b connected to the first line 270a.

The timing controller 140, the second memory 150, and a power block 160 can be disposed on the control printed circuit board 241. The timing controller 140 can transmit a signal at a high speed in accordance with protocols, and receive data from the second memory 150 during operation. Since the second memory 150 supplies data to the timing controller 140 that processes data at a high speed, and thus can be disposed adjacent to the timing controller 140.

The timing controller 140 can be disposed at a location on the control printed circuit board 241, at which a distance from the timing controller 140 to the first source printed circuit board 221 and a distance from the timing controller 140 to the second source printed circuit board 222 are the same. The timing controller 140 can be disposed in the center of the control printed circuit board 241. In the timing controller 140, when a time for transmitting at least one signal to the first source printed circuit board 221 is different from a time for transmitting the at least one signal to the second source printed circuit board 222, there is a possibility that images displayed on the display panel 110 can be distorted. However, it is possible to prevent a difference in times for transmitting one or more signals from occurring by adjusting a location at which the timing controller 140 is disposed on the control printed circuit board 241.

The second memory 150 can comprise four double data rate synchronous dynamic random-access of memories (DDR). The DDR can supply stored data to the timing controller 140, and store data calculated by the timing controller 140 and supply the stored data to the NAND flash memory.

The power block 160 can comprise a power management integrated circuit (PMIC), a gamma circuit, a buck booster converter. However, embodiments of the present disclosure are not limited thereto. The second memory 150 can be disposed in the vicinity of the timing controller 140. The second memory 150 can comprise four double data rate synchronous dynamic random-access of memories (DDR). However, embodiments of the present disclosure are not limited thereto.

A ground pattern GND can be disposed between the first and second areas 221a and 221b. The ground pattern GND electrically shields each of the first area 221a and the second area 221b from each other, and can minimize or reduce interference between signals transferred to the first signal line 230 disposed in the first area 221a and the second signal line 270 disposed in the second area 221b. The length of the ground pattern GND may correspond to the length of the first surface 301a.

Each of the first source printed circuit board 221 and the second source printed circuit board 222 can be connected to the control printed circuit board 241 through one flexible cable 261 or 262. However, embodiments of the present disclosure are not limited thereto. The first and second connectors 271 and 272 can be disposed on the control printed circuit board 241, and the third connector 273 and the fourth connector 274 can be disposed on the first source printed circuit board 221 and the second source printed circuit board 222, respectively.

As shown in FIGS. 8 and 9, one end of the first flexible cable 261 can be connected to the first connector 271 disposed on the control printed circuit board 241, and the other end of the first flexible cable 261 can be connected to the third connector 273 disposed on the first source printed circuit board 221. One end of the second flexible cable 262 can be connected to the second connector 272 disposed on the control printed circuit board 241, and the other end of the second flexible cable 262 can be connected to the fourth connector 274 disposed on the second source printed circuit board 222. As shown in FIGS. 10 and 11, the first flexible cable 261 can comprise fifth and sixth flexible cables 261a and 261b, and the second flexible cable 262 can comprise seventh and eighth flexible cables 262a and 262b. Signals transmitted between the first memory 250 and the timing controller 140 can be delivered through the fifth flexible cables 261a. Signals transmitted between the first driver IC 281 and the timing controller 140 can be delivered through the sixth flexible cables 261b. However, embodiments of the present disclosure are not limited thereto. When the first memory 250 is disposed only on the first source printed circuit board 221, a signal may not be delivered through at least one of the seventh and eighth flexible cables 262a and 262b connecting between the control printed circuit board 241 and the second source printed circuit board 222.

In this situation, the at least one of the seventh and eighth flexible cables 262a and 262b may not be disposed. When the first flexible cable 261 can comprise fifth and sixth flexible cables 261a and 261b, and the second flexible cable 262 can comprise seventh and eighth flexible cables 262a and 262b, a signal transferred between the first memory 250 and the timing controller 140 and a signal transferred between at least one deliver IC 281 of the first and second source printed circuit boards 221 and 222 and the timing controller 140 are separated from each other. Therefore, interference between signals maybe be reduced.

Figure 12:
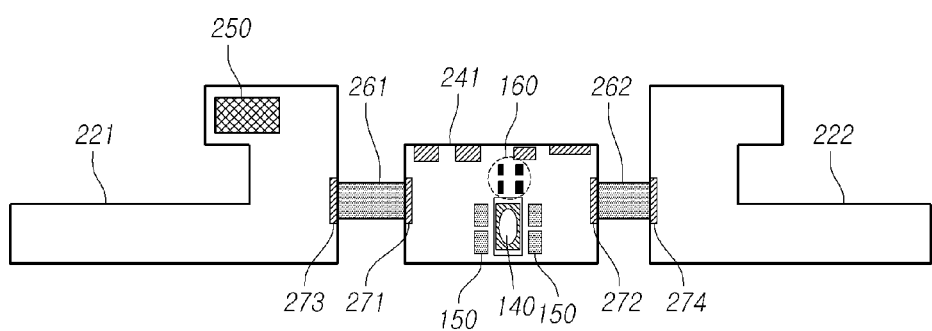
FIG. 12 is a plan view of a third embodiment of an arrangement of the first source printed circuit board, the second source printed circuit board and the control printed circuit board shown in FIG. 6 according to an embodiment of the present disclosure.
Figure 13:
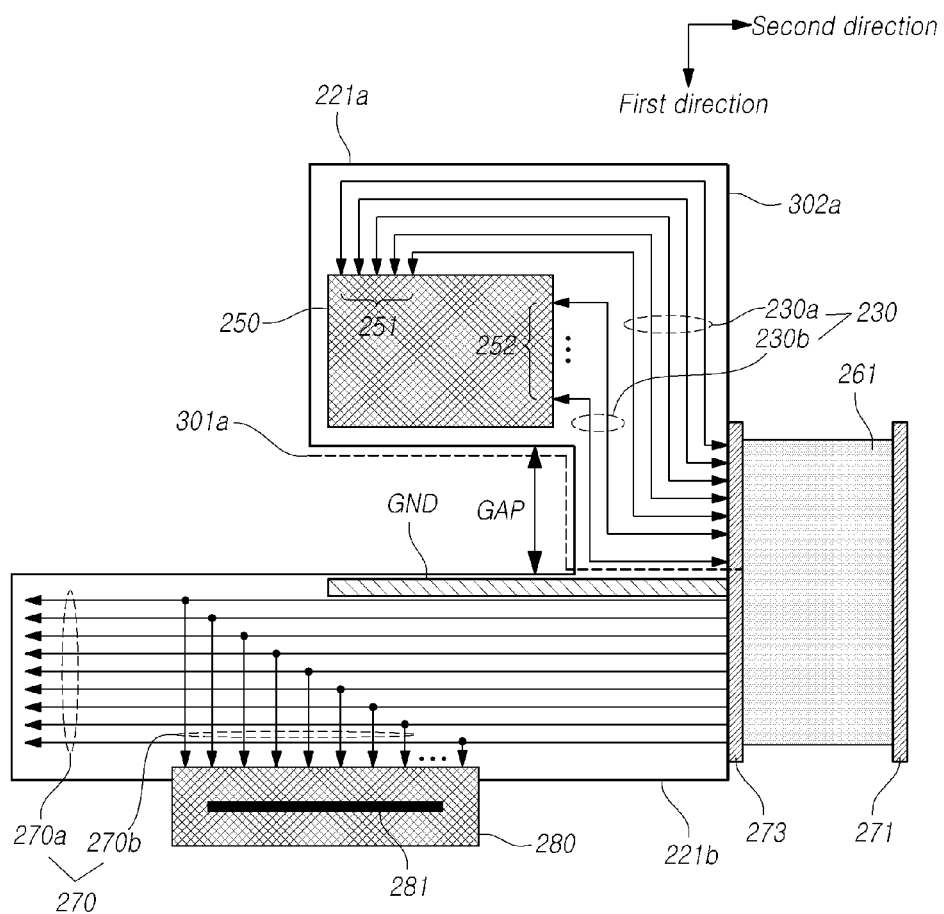
FIG. 13 is an enlarged plan view of the first source printed circuit board and the flexible cable shown in FIG. 12 according to an embodiment of the present disclosure.
Figure 14:
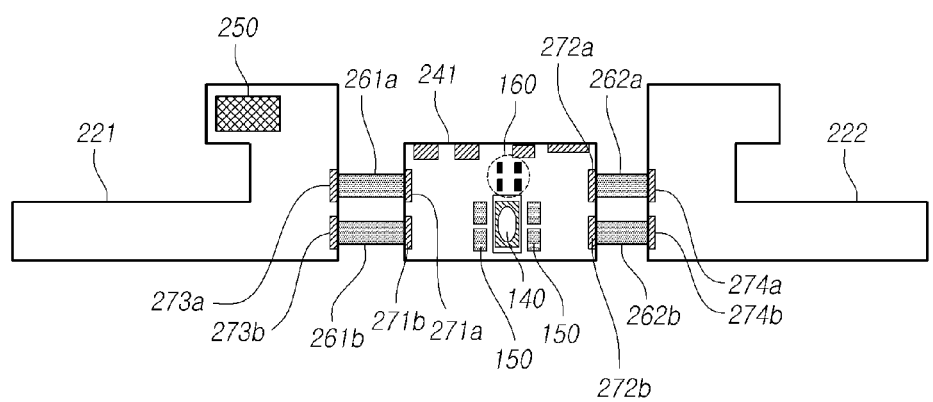
FIG. 14 is a plan view of a fourth embodiment of an arrangement of the first source printed circuit board, the second source printed circuit board and the control printed circuit board shown in FIG. 6 according to an embodiment of the present disclosure.
Figure 15:
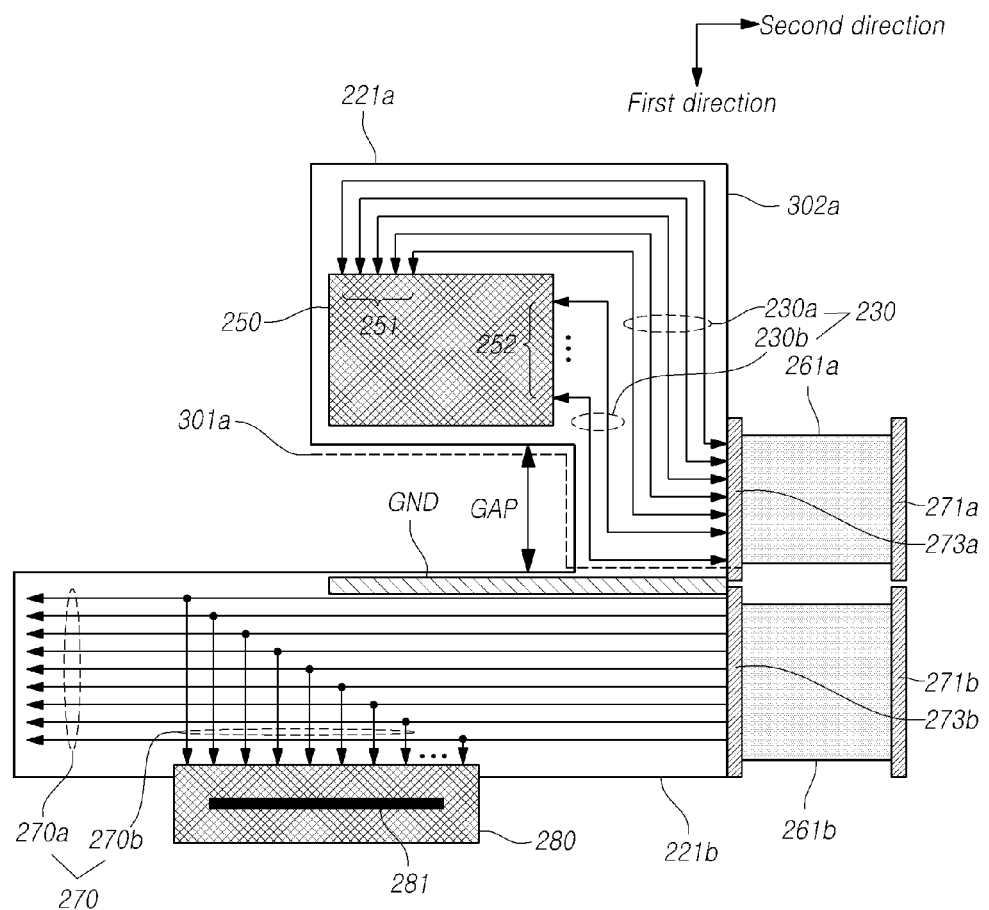
FIG. 15 is an enlarged plan view of the first source printed circuit board and the flexible cable shown in FIG. 14 according to an embodiment of the present disclosure.

FIG. 12 is a plan view of a third embodiment of an arrangement of the first source printed circuit board, the second source printed circuit board, and the control printed circuit board shown in FIG. 6 according to an embodiment of the present disclosure. FIG. 13 is an enlarged plan view of the first source printed circuit board and the flexible cable shown in FIG. 12 according to an embodiment of the present disclosure. FIG. 14 is a plan view of a fourth embodiment of an arrangement of the first source printed circuit board, the second source printed circuit board, and the control printed circuit board shown in FIG. 6 according to an embodiment of the present disclosure. FIG. 15 is an enlarged plan view of the first source printed circuit board and the flexible cable shown in FIG. 14 according to an embodiment of the present disclosure.

Referring to FIGS. 12 to 15, the first source printed circuit board 221 can comprise a first area 221a in which a first memory 250 and a first signal line 230 are disposed, and a second area 221b connected to the driver IC 281 and in which a second signal line 270 is disposed. The second source printed circuit board 222 can be disposed in the same form or pattern as the first source printed circuit board 221. However, embodiments of the present disclosure are not limited thereto. The first memory 250 is shown to be located on the first source printed circuit board 221 in the drawings. However, embodiments of the present disclosure are not limited thereto. For example, the memory 250 may be located on the second source printed circuit board 222.

The first and second source printed circuit boards 221 and 222 may not have constant widths in the second direction by the first area 221a. The sum of widths of the first and second areas 221a and 222b is shown to be larger than the width of the control printed circuit board 241. However, embodiments of the present disclosure are not limited thereto. The first area 221a can comprise a first surface 301a facing or corresponding to the second area 221b and a second surface 302a facing or corresponding to the control printed circuit board 241. A part of the first area 221a contacts the second area 221b, and another part thereof does not contact the second area 221b. Therefore, a gap GAP between the first area 221a and the second area 221b can be maintained. The first surface 301a may be formed with a stepped portion by the gap GAP.

The first memory 250, and the first signal line 230 for transmitting a signal to or receiving a signal from the first memory 250 can be disposed in the first area 221a. The first memory 250 can prevent data stored therein from being reset even when power is turned off. The first memory 250 may be a NAND flash memory. However, embodiments of the present disclosure are not limited thereto. A control signal input terminal 251 of the first memory 250 for receiving a control signal can be disposed on a surface opposite to the first surface 301a of the first area 221a, and a data signal input and output terminal 252 of the first memory 250 for enabling a data signal to be input or output can be disposed on a surface facing or corresponding to the second surface 302a. The control signal input terminal 251 can be connected to a control signal line 230a of the first signal line 230 including a plurality of lines. The control signal line 230a can comprise a plurality of signal lines for delivering a signal including a first memory read (Nand_read_en) command from the timing controller 140, and a signal including a first memory write (Nand_write_en) command Signals including commands delivered by the control signal line 230a are not limited thereto. The first memory 250 can operate in response to the commands included in the signals delivered from the control signal line 230a. The signals delivered through the control signal line 230a are unidirectional signals delivered from the timing controller 140 to the first memory 250.

The data signal input and output terminal 252 can be connected to a data signal line 230b of the first signal line 230. The data signal input and output terminal 252 can enable data stored in the first memory 250 to be output and delivered to the second memory 150, or enable data stored in the second memory 150 to be received and stored in the first memory 250, according to the commands delivered through the control signal line 230a of the first signal line 230.

The film 280 on which the driver IC 281 is disposed, and the second signal line 270 for supplying a signal to the driver IC 281 and delivering a signal output from the driver IC 281 can be disposed in the second area 221b. The second signal line 270 can comprise a first line 270a including a plurality of lines that extends in the second direction. The second signal line 270 extends in the first direction to be connected to one or more lines disposed on the film 280 including the driver IC 281 and can comprise a second line 270b connected to the first line 270a. The first line 270a and the second line 270b can comprise a signal line delivering a control signal for controlling the driver IC, a signal line delivering an image signal, a signal line delivering power, or the like. However, embodiments of the present disclosure are not limited thereto.

A gap GAP that maintains a substantial constant distance is formed between the first area 221a and the second area 221b, and the gap GAP maintaining the substantial constant distance helps prevent interference between a signal transferred to the first area 221a and a signal transferred to the second area 221b from occurring. A ground pattern GND can be disposed between the first and second areas 221a and 222b to prevent signal interference.

The timing controller 140, the second memory 150, and the power block 160 can be disposed on the control printed circuit board 241. The timing controller 140 can transmit a signal at a high speed in accordance with protocols, and receive data from the second memory 150 during operation. Since the second memory 150 supplies data to the timing controller 140 that processes data at a high speed, and thus can be disposed adjacent to the timing controller 140.

The timing controller 140 can be disposed at a location at which a distance from the timing controller 140 to the first source printed circuit board 221 and a distance from the timing controller 140 to the second source printed circuit board 222 are the same. The timing controller 140 can be disposed in the center of the control printed circuit board 241. In the timing controller 140, when a time for transmitting at least one signal to the first source printed circuit board 221 is different from a time for transmitting the at least one signal to the second source printed circuit board 222, there is a possibility that images displayed on the display panel 110 can be distorted. However, it is possible to prevent a difference in times for transmitting one or more signals from occurring by adjusting a location at which the timing controller 140 is disposed on the control printed circuit board 241.

The second memory 150 can comprise four double data rate synchronous dynamic random-access of memories (DDR). The number and types of memories included in the second memory are not limited thereto. The second memory 150 can supply stored data to the timing controller 140, and store data calculated by the timing controller 140 and supply the stored data to the second memory 150.

The power block 160 can comprise a power management integrated circuit (PMIC), a gamma circuit, a buck booster converter. However, embodiments of the present disclosure are not limited thereto. The second memory 150 can be disposed in the vicinity of the timing controller 140. The power block 160 can be disposed over the timing controller 140 at a location at which a distance from the power block 160 to the first source printed circuit board 221 and a distance from the power block 160 to the second source printed circuit board 222 are substantially or nearly equal. However, embodiments of the present disclosure are not limited thereto.

A ground pattern GND can be disposed between the first and second areas 221a and 222b. The ground pattern GND electrically shields each of the first area 221a and the second area 221b from each other, and can minimize interference between signals transferred to the first signal line 230 disposed in the first area 221a and the second signal line 270 disposed in the second area 221b. The length of the ground pattern GND may correspond to the length of the first surface 301a.

Each of the first source printed circuit board 221 and the source printed circuit board 222 can be connected to the control printed circuit board 241 through one flexible cable 261 or 262. The first and second connectors 271 and 272 can be disposed on the control printed circuit board 241, and the third connector 273 and the fourth connector 274 can be disposed on the first source printed circuit board 221 and the second source printed circuit board 222, respectively.

As shown in FIGS. 12 and 13, one end of the first flexible cable 261 can be connected to the first connector 271 disposed on the control printed circuit board 241, and the other end of the first flexible cable 261 can be connected to the third connector 273 disposed on the first source printed circuit board 221. Further, one end of the second flexible cable 262 can be connected to the second connector 272 disposed on the control printed circuit board 241, and the other end of the second flexible cable 262 can be connected to the fourth connector 274 disposed on the second source printed circuit board 222. As shown in FIGS. 14 and 15, the first flexible cable 261 can comprise fifth and sixth flexible cables 261a and 261b, and the second flexible cable 262 can comprise seventh and eighth flexible cables 262a and 262b. The fifth flexible cables 261a can connect between the first memory 250 and the timing controller 140, and the sixth flexible cables 261b can connect between the first driver IC 281 and the timing controller 140. When the first flexible cable 261 can comprise fifth and sixth flexible cables 261a and 261b, a signal transferred between the first memory 250 and the timing controller 140 and a signal transferred between at least one deliver IC 281 of the first and second source printed circuit boards 221 and 222 and the timing controller 140 are separated from each other. Therefore, interference between signals maybe be reduced.

Figure 16:
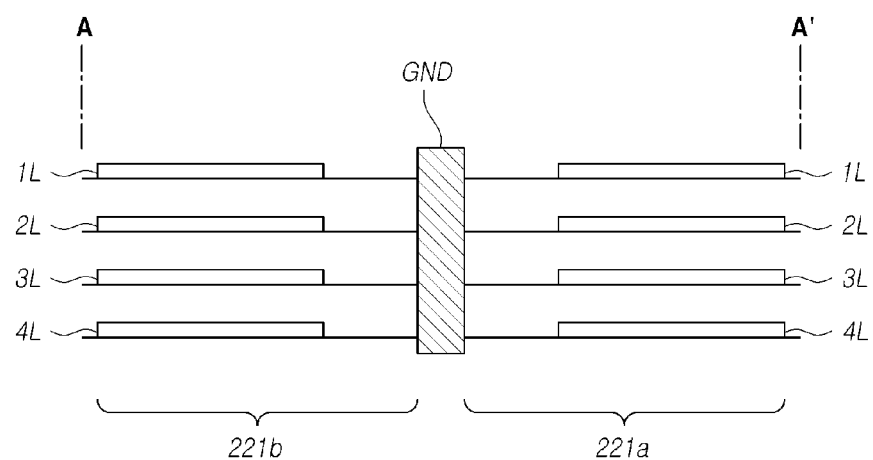
FIG. 16 is a sectional view taken along line A-A' of the first printed circuit board shown in FIG. 9 according to an embodiment of the present disclosure.

FIG. 16 is a sectional view taken along line A-A' of the first source printed circuit board shown in FIG. 9 according to an embodiment of the present disclosure.

Referring to FIG. 16, the first source printed circuit board 221 can comprise a plurality of layers including a first layer, a second layer, a third layer, and a fourth layer 1L to 4L. Signal lines can be arranged on the first layer 1L, and lines for supplying power can be arranged on the second layer 2L. Signal lines that are not disposed on the first layer 1L or different types from those disposed on the first layer 1L can be arranged on the third layer 3L, and a ground line can be disposed on the fourth later 4L. However, embodiments of the present disclosure are not limited thereto.

The ground pattern GND disposed between the first and second areas 221a and 222b can be integrally formed with all or at least one of the first, second, third, and fourth layers 1L to 4L. However, embodiments of the present disclosure are not limited thereto. For example, the ground pattern GND may be disposed on the first and second layer 1L and 2L among the four layers. The ground pattern GND helps reduce or prevent interference between a signal transferred to the first area 221a and a signal transferred to the second area 221b.

Figure 17:
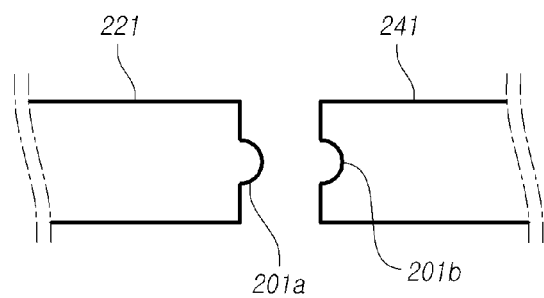
FIG. 17 is a sectional view illustrating the first printed circuit board and the control printed circuit board shown in FIG. 6 are connected in the form of a slot according to an embodiment of the present disclosure.

FIG. 17 is a sectional view illustrating the first source printed circuit board and the control printed circuit board shown in FIG. 6 are connected in the form of a slot according to an embodiment of the present disclosure.

Referring to FIG. 17, a protrusion 201a can be formed on one side surface of the first source printed circuit board 221, and a groove 201b corresponding to the protrusion 201a can be formed on the control printed circuit board 241, or vice versa. The protrusion 201a and the groove 201b can be formed with a pre-configured length on the one side surface of the first source printed circuit board 221 and on one side surface of the control printed circuit board 241, respectively. The first source printed circuit board 221 and the control printed circuit board 241 can be coupled such that the groove 201b is fastened to the protrusion 201a in a sliding manner With this type of coupling, the control printed circuit board 241 can be directly coupled to the first source printed circuit board 221. FIG. 17 shows that the protrusion 201a is formed on the first source printed circuit board 221, and the groove 201b is formed on the control printed circuit board 241. However, embodiments of the present disclosure are not limited thereto.

Even when the flexible cable 261 is not used, the first source printed circuit board 221 can be coupled to the control printed circuit board 241 with the protrusion 201a and the groove 201b. When the first source printed circuit board 221 and the control printed circuit board 241 are coupled, lines arranged on the first source printed circuit board 221 and lines arranged on the control printed circuit board 241 can be connected by being brought into close contact with each other. Likewise, the second source printed circuit board 222 can be coupled to the control printed circuit board 241 without using the flexible cable 262 as well. The shapes, locations and sizes of the protrusion 201a and the groove 201b are not limited thereto.

The features, structures, configurations, and effects described in the present disclosure are included in at least one embodiment but are not necessarily limited to a particular embodiment. A person skilled in the art can apply the features, structures, configurations, and effects illustrated in the particular embodiment to one or more other additional embodiments by combining or modifying such features, structures, configurations, and effects. It should be understood that all such combinations and modifications are included within the scope of the present disclosure Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The scope of protection of the present disclosure should be construed based on the following claims, and all technical ideas within the scope of equivalents thereof should be construed as being included within the scope of the present disclosure.

What is claimed is:

1. An organic light emitting display apparatus comprising:
a display panel;
a first source printed circuit board connected to the display panel in a first direction, and including a first memory disposed in an area of the first source printed circuit board;
a second source printed circuit board connected to the display panel in the first direction,
a control printed circuit board disposed between the first source printed circuit board and the second source printed circuit board, and connected to each of the first source printed circuit board and the second source printed circuit board,
wherein a direction in which the control printed circuit board and the first source printed circuit board are connected and a direction in which the control printed circuit board and the second source printed circuit board are connected are a second direction different from the first direction, wherein the first source printed circuit board comprises a first area in which the first memory and a first signal line are disposed, and a second area connected to a data driver and in which a second signal line is disposed, and wherein the first memory comprises a control signal input terminal disposed on either a surface facing or corresponding to, or a surface opposite to, a first surface for receiving a control signal, and a data input and output terminal disposed on a surface facing or corresponding to a second surface for allowing a data signal to be input or output.

2. The organic light emitting display apparatus according to claim 1, wherein the control printed circuit board comprises a first connector and a second connector disposed on both side surfaces facing each of the first source printed circuit board and the second source printed circuit board, and the first connector is connected to the first source printed circuit board through a first flexible cable, and the second connector is connected to the second source printed circuit board through a second flexible cable.

3. The organic light emitting display apparatus according to claim 2, wherein the first source printed circuit board comprises a third connector disposed on a surface facing the control printed circuit board, and the first connector is connected to the third connector.

4. The organic light emitting display apparatus according to claim 2, wherein the second source printed circuit board comprises a fourth connector disposed on a surface facing the control printed circuit board, and the second connector is connected to the fourth connector.

5. The organic light emitting display apparatus according to claim 1, wherein the first direction and the second direction are perpendicular to each other.

6. The organic light emitting display apparatus according to claim 1, wherein the first source printed circuit board comprises a ground pattern that is disposed between the first area and the second area.

7. The organic light emitting display apparatus according to claim 1, wherein a gap is formed between the first area and the second area.

8. The organic light emitting display apparatus according to claim 6, wherein all or at least one of the first source printed circuit board and the second source printed circuit board comprises a plurality of layers, and the ground pattern is integrally formed with at least the first layer and the second layer of the plurality of layers.

9. The organic light emitting display apparatus according to claim 1, the first surface facing or corresponding to the second area, and the second surface facing or corresponding to the control printed circuit board, and wherein the first surface contacts the second area.

10. The organic light emitting display apparatus according to claim 1, further comprising a first flexible cable and a second flexible cable, wherein the first flexible cable delivers a signal between the first memory and a timing controller, and the second flexible cable delivers a signal between the data driver and the timing controller.

11. The organic light emitting display apparatus according to claim 1, wherein the data driver comprises a first driver integrated circuit and a second driver integrated circuit, and the first driver integrated circuit is disposed on a first film connected to the first source printed circuit board, and the second driver integrated circuit is disposed on a second film connected to the second source printed circuit board.

12. The organic light emitting display apparatus according to claim 1, wherein the control printed circuit board is coupled to each of the first source printed circuit board and the second source printed circuit board.

13. The organic light emitting display apparatus according to claim 12, where in the two adjacent pixels receive data signals at different times.

14. The organic light emitting display apparatus according to claim 1, wherein the display panel comprises a plurality of data lines that runs in the first direction and a plurality of gate lines that runs in the second direction, and two adjacent pixels in the second direction are connected to an identical data line and different gate lines.

15. The organic light emitting display apparatus according to claim 1, further comprising a timing controller, the timing controller disposed at a location on the control printed circuit board, at which a distance from the timing controller to the first source printed circuit board and a distance from the timing controller to the second source printed circuit board are the same.

* * * * *